(12) United States Patent
Sasaki et al.

(10) Patent No.: US 7,898,272 B2
(45) Date of Patent: Mar. 1, 2011

(54) PROBE CARD

(75) Inventors: Shunsuke Sasaki, Tokyo (JP); Tsuyoshi Inuma, Nagano (JP); Yoshio Yamada, Nagano (JP); Mitsuhiro Nagaya, Nagano (JP); Takashi Akao, Nagano (JP); Hiroshi Nakayama, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/308,110

(22) PCT Filed: Jun. 4, 2007

(86) PCT No.: PCT/JP2007/061317
§ 371 (c)(1),
(2), (4) Date: May 6, 2009

(87) PCT Pub. No.: WO2007/142204
PCT Pub. Date: Dec. 13, 2007

(65) Prior Publication Data
US 2010/0001748 A1 Jan. 7, 2010

(30) Foreign Application Priority Data
Jun. 8, 2006 (JP) ................ 2006-159679

(51) Int. Cl.
*G01R 31/02* (2006.01)
(52) U.S. Cl. ....................... 324/754; 324/758
(58) Field of Classification Search ........... 324/750–765
See application file for complete search history.

(56) References Cited

U.S. PATENT DOCUMENTS

| 4,567,432 | A  | * | 1/1986  | Buol et al. ............... 324/760 |
| 5,974,662 | A  | * | 11/1999 | Eldridge et al. ............ 29/842 |
| 6,043,666 | A  |   | 3/2000  | Kazama et al. |
| 6,334,247 | B1 | * | 1/2002  | Beaman et al. ............. 29/842 |
| 6,509,751 | B1 |   | 1/2003  | Mathieu et al. |
| 6,686,754 | B2 | * | 2/2004  | Miller ..................... 324/754 |
| 7,071,715 | B2 |   | 7/2006  | Shinde et al. |
| 7,081,766 | B2 |   | 7/2006  | Satou et al. |
| 7,368,927 | B2 | * | 5/2008  | Smith et al. ............... 324/754 |
| 7,772,858 | B2 | * | 8/2010  | Sasaki et al. .............. 324/754 |

(Continued)

FOREIGN PATENT DOCUMENTS

JP          63-293934          11/1988

(Continued)

OTHER PUBLICATIONS

International Search Report mailed Aug. 21, 2007, issued on PCT/JP2007/061317.

(Continued)

*Primary Examiner* — Ha Tran T Nguyen
*Assistant Examiner* — Joshua Benitez
(74) *Attorney, Agent, or Firm* — Edwards Angell Palmer & Dodge LLP

(57) ABSTRACT

A probe card includes a flat wiring board having a wiring pattern corresponding to a circuit structure for generating a signal for a test, an interposer that is stacked on the wiring board and relays wirings of the wiring board, a space transformer that is stacked on the interposer and fastened thereto by an adhesive, transforms a space between the wirings relayed by the interposer, and leads the wirings out to a surface opposite a surface facing the interposer, and a probe head that is stacked on the space transformer and houses and holds a plurality of probes.

8 Claims, 11 Drawing Sheets

U.S. PATENT DOCUMENTS

2004/0179343 A1* 9/2004 Karavakis et al. ............ 361/771

FOREIGN PATENT DOCUMENTS

| JP | 09-199552 | 7/1997 |
| JP | 10-019926 | 1/1998 |
| JP | 3386077 | 6/1998 |
| JP | 2000-091391 | 3/2000 |
| JP | 2005-164600 | 6/2005 |
| TW | 200508618 A | 3/2005 |
| TW | 200537113 A | 11/2005 |

OTHER PUBLICATIONS

Notice of Allowance for Taiwanese Patent Application No. 096120475 mailed Oct. 4, 2010.

* cited by examiner

PROBE CARD

TECHNICAL FIELD

The present invention relates to a probe card that electrically connects a semiconductor wafer as a test object and a circuit structure for generating a signal for a test.

BACKGROUND ART

In a semiconductor test process, a conductivity test is sometimes performed to detect a defective product by bringing probes having conductivity (conductive probes) into contact with a semiconductor wafer before dicing (WLT: Wafer Level Test). When this WLT is performed, to transfer a signal for a test generated and sent by a testing device (tester) to the semiconductor wafer, a probe card including a large number of probes is used. In the WLT, the probes are individually brought into contact with each of dies on the semiconductor wafer while the dies are scanned by the probe card. However, because several hundreds to several ten thousands dies are formed on the semiconductor wafer, it takes considerable time to test one semiconductor wafer. Thus, an increase in the number of dies causes higher cost.

To solve the problems of the WLT, recently, a method called FWLT (Full Waver Level Test) is also used in which several hundreds to several ten thousands probes are collectively brought into contact with all or at least a quarter to a half of dies on a semiconductor wafer. To accurately bring the probes into contact with electrode pads on the semiconductor wafer, technologies for maintaining positional accuracy of tips of probes by accurately keeping the parallelism or the flatness of a probe card with respect to a predetermined reference surface and for highly accurately aligning a semiconductor wafer are known in this method (see, for example, Patent Document 1 or 2).

FIG. 11 is a diagram schematically showing an example of the structure of a probe card applied in the FWLT. A probe card 8 shown in FIG. 11 includes a plurality of probes 9 provided according to an arrangement pattern of the electrode pads on a semiconductor wafer, a probe head 81 that houses the probes 9, a space transformer 82 that transforms an interval of a fine wiring pattern in the probe head 81, an interposer 83 for connection of wires led out from the space transformer 82, a substrate 84 that connects wires through the interposer 83 to a testing device, a male connector 85 provided on the substrate 84 and connected to a female connector provided on the testing device side, and a reinforcing member 86 for reinforcing the substrate 84.

Among these components, as the interposer 83, the one having a thin-film base material made of an insulating material such as ceramic and a plurality of leaf-spring connection terminals disposed in a predetermined pattern on both sides of the base material and formed in a cantilever shape is known. In the case of this interposer, connection terminals provided on one surface of the interposer 83 come into contact with electrode pads of the space transformer 82 and connection terminals provided on the other surface come into contact with electrode pads of the substrate 84, whereby electrical connection is established between the space transformer 74 and the substrate 77.

Patent Document 1: Japanese Patent No. 3386077
Patent Document 2: Japanese Patent Application Laid-open No. 2005-164600

DISCLOSURE OF INVENTION

Problem to be Solved by the Invention

However, the conventional probe card represented by the probe card 8 has a problem in that, because the interposer applies elastic force to the space transformer, warp is caused in the space transformer by this elastic force. In this case, the probe head substantially in close contact with the space transformer also warps following the space transformer, leading to a fall in flatness of the heights of the tips of the probes. As a result, the probe held in the center of the probe head comes into contact with the semiconductor wafer earlier than the probe held in the periphery of the probe head. This causes instability of the resistance of contact with the semiconductor wafer.

This problem is conspicuous in particular when a semiconductor wafer having the diameter of 12 inches (about 300 mm) is a test object. A probe card applicable to the semiconductor wafer having the diameter of 12 inches has a problem in that warp is larger because the probe card has a larger number of probes stored therein (several thousands to several tens thousands) and a larger surface area of a space transformer than a probe card applicable to a semiconductor wafer having the diameter of 8 inches (about 200 mm).

In general, for a space transformer including a multilayer substrate of ceramics or the like, to impart mechanical rigidity for allowing the space transformer to resist elastic force (reaction force) received from an interposer, the thickness of the space transformer is increased as much as possible by applying measures such as addition of a dummy layer thereto. However, there is a problem in that, to increase the number of wiring layers, manufacturing takes long time, and the cost increases.

The present invention has been achieved to solve the above problems in the conventional technology and it is an object of the present invention to provide a probe card that can realize improvement of rigidity of a space transformer easily and at low cost.

Means For Solving Problem

According to an aspect of the present invention, a probe card that houses a plurality of probes for electrically connecting a semiconductor wafer as a test object and a circuit structure for generating a signal for a test, includes: a flat wiring board that has a wiring pattern corresponding to the circuit structure; an interposer that is stacked on the wiring board and relays wirings of the wiring board; a space transformer that is stacked on and fastened to the interposer, transforms a space between the wirings relayed by the interposer, and leads the wirings out to a surface opposite a surface facing the interposer; and a probe head that is stacked on the space transformer and houses and holds the probes.

The interposer and the space transformer, when stacked, may be bonded by an adhesive.

The adhesive may be applied to surfaces of the interposer and the space transformer facing each other except where electrical connection is established between the interposer and the space transformer.

In the probe card, a resist layer may be provided on surfaces of the interposer and the space transformer facing each other in such a manner as to surround where electrical connection is established between the interposer and the space transformer.

The adhesive may be applied in a sheet form.

The interposer and the space transformer, when stacked, may be fastened together by a first screw member.

The probe card may further include a plurality of first post members, each having a height larger than the thickness of the wiring board, that are embedded in the wiring board to pierce therethrough from a surface thereof where the interposer is stacked.

The probe card may further include a second post member having the same height as that of the first post members that is embedded in a center of the wiring board to pierce therethrough, and includes a hollow portion piercing in a height direction thereof, and a second screw member that is inserted through the hollow portion of the second post member and fastens the wiring board and the interposer.

The interposer may include a plurality of connection terminals that is made of a conductive material and is extensible and compressible in an axial direction, and a housing that is made of an insulating material and includes a plurality of through holes to individually house the connection terminals.

The connection terminals may be in a coil shape, and may each include a pair of electrode pins each of which is closely wound to be tapered toward either end in the axial direction, and a coil spring that connects between the electrode pins.

The coil spring may include a tightly wound portion that is arranged in a middle, in the axial direction, of each of the connection terminals, a constantly wound portion that is arranged on a side of the tightly wound portion, and a loosely wound portion that is arranged on a side of the tightly wound portion other than where the constantly wound portion is arranged, in which a coil is wound more loosely than in the constantly wound portion.

EFFECT OF THE INVENTION

According to an aspect of the present invention, it is possible to improve the rigidity of the space transformer easily and at low cost.

Figure 1:
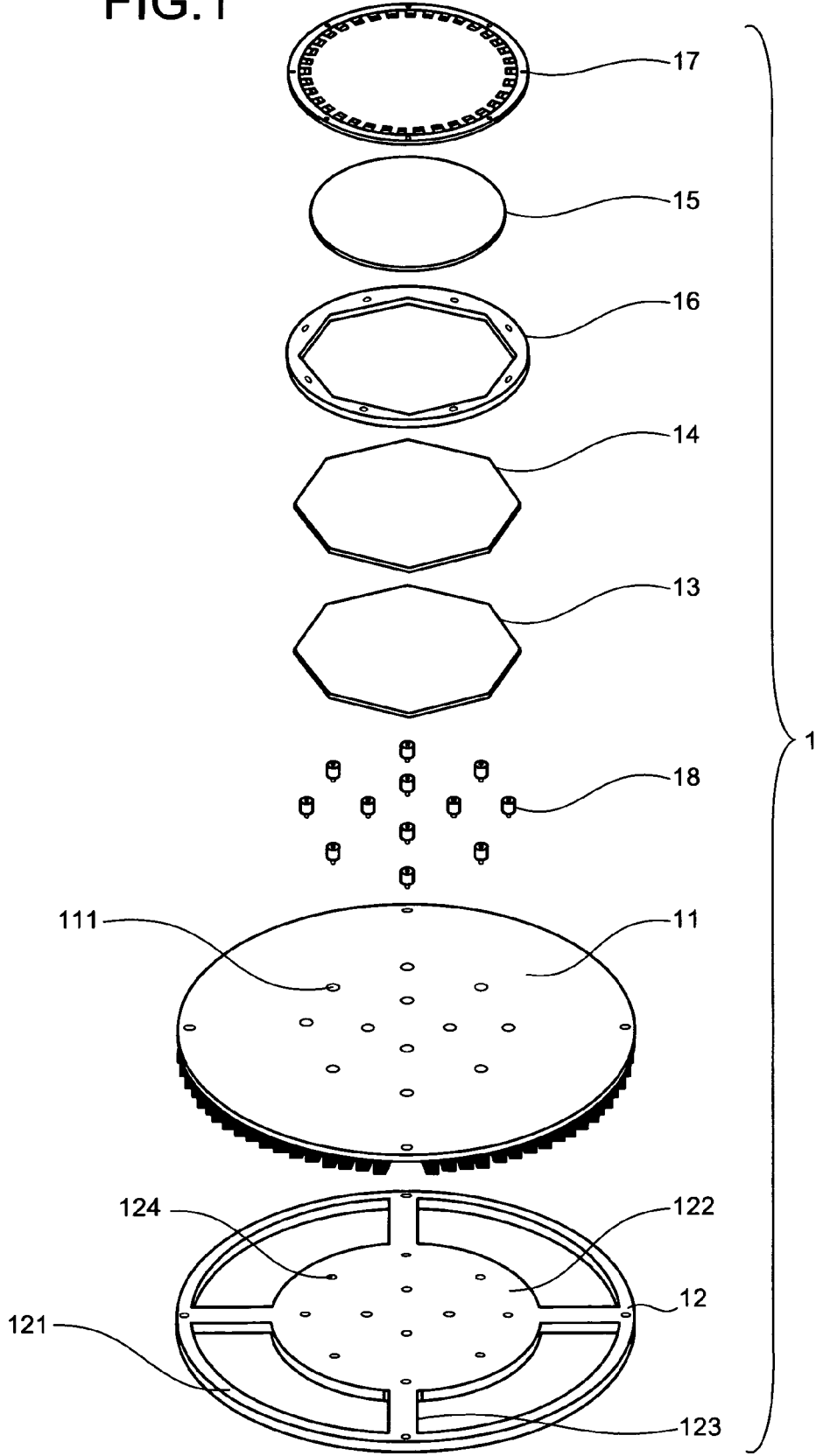
FIG. 1 is a exploded perspective view of the structure of relevant part of a probe card according to a first embodiment of the present invention.

EXPLANATIONS OF LETTERS OR NUMERALS 1, 6, 7, 8 probe card
2, 9 probe
3 prober
4 connector seat
5 semiconductor wafer
11, 61, 84 wiring board
12, 62, 86 reinforcing member
13, 63, 73, 83 interposer
14, 74, 82 space transformer
15, 81 probe head
15p probe housing area
16 holding member
17 leaf spring
18, 68 post member
18a, 68a large diameter portion
18b, 68b small diameter portion
19 adhesive
20, 85 male connector
21, 22 needle-like member
21a, 22a needle-like portion
21b, 22c boss portion
21c shaft portion
22b flange portion
23 spring member
23a roughly wound portion
23b closely wound portion
24 resist
31 probe card holder
32 pressing jig
40 female connector
50 wafer chuck
51, 112, 141, 142 electrode pad
111, 133, 151, 621, 631, 731, 741 through hole
121 outer periphery
122 center
123 coupling portion
124 recess
131 housing
132 connection terminal
132a coil spring portion
132b, 132c electrode pin
132d steadily wound portion
132e closely wound portion
132f roughly wound portion
151a small diameter hole
151b large diameter hole
171 pawl
201, 202 screw member
w wiring

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like may be different from realistic ones. It goes without saying that, the drawings may depict some portion as having different relations and ratios of dimensions.

First Embodiment

Figure 2:
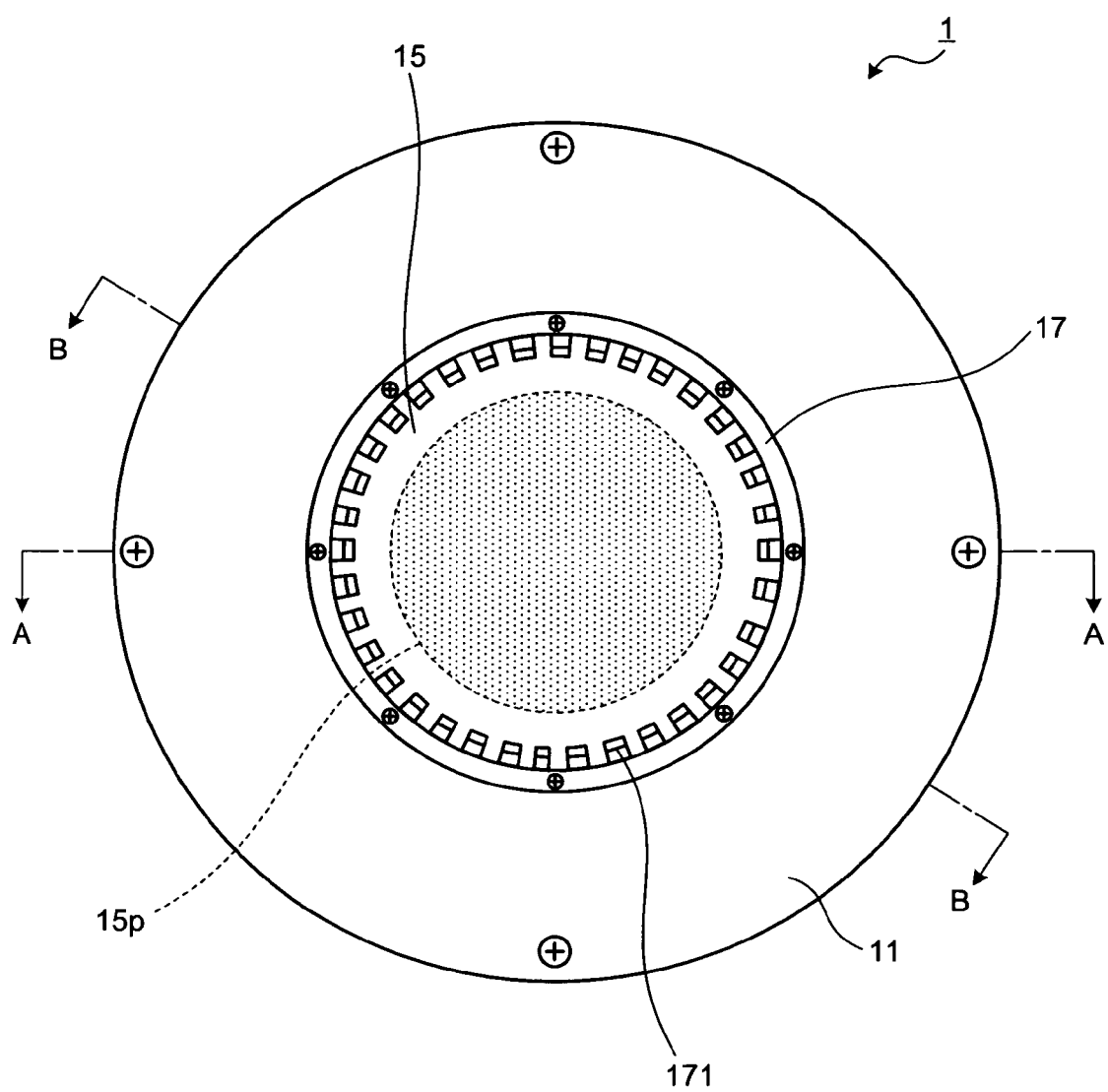
FIG. 2 is a top view of the structure of the probe card according to the first embodiment of the present invention.
Figure 3:
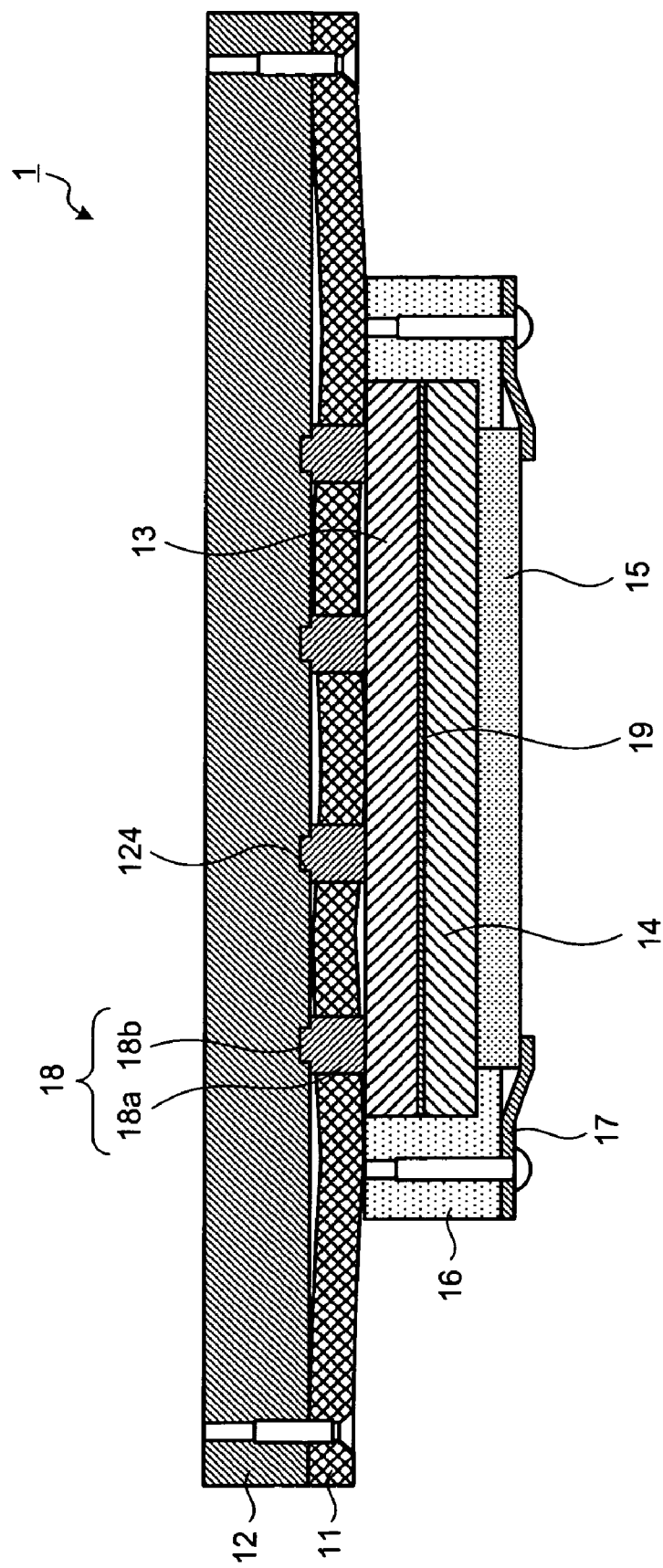
FIG. 3 is a sectional view taken along an A-A line shown in FIG. 2.
Figure 4:
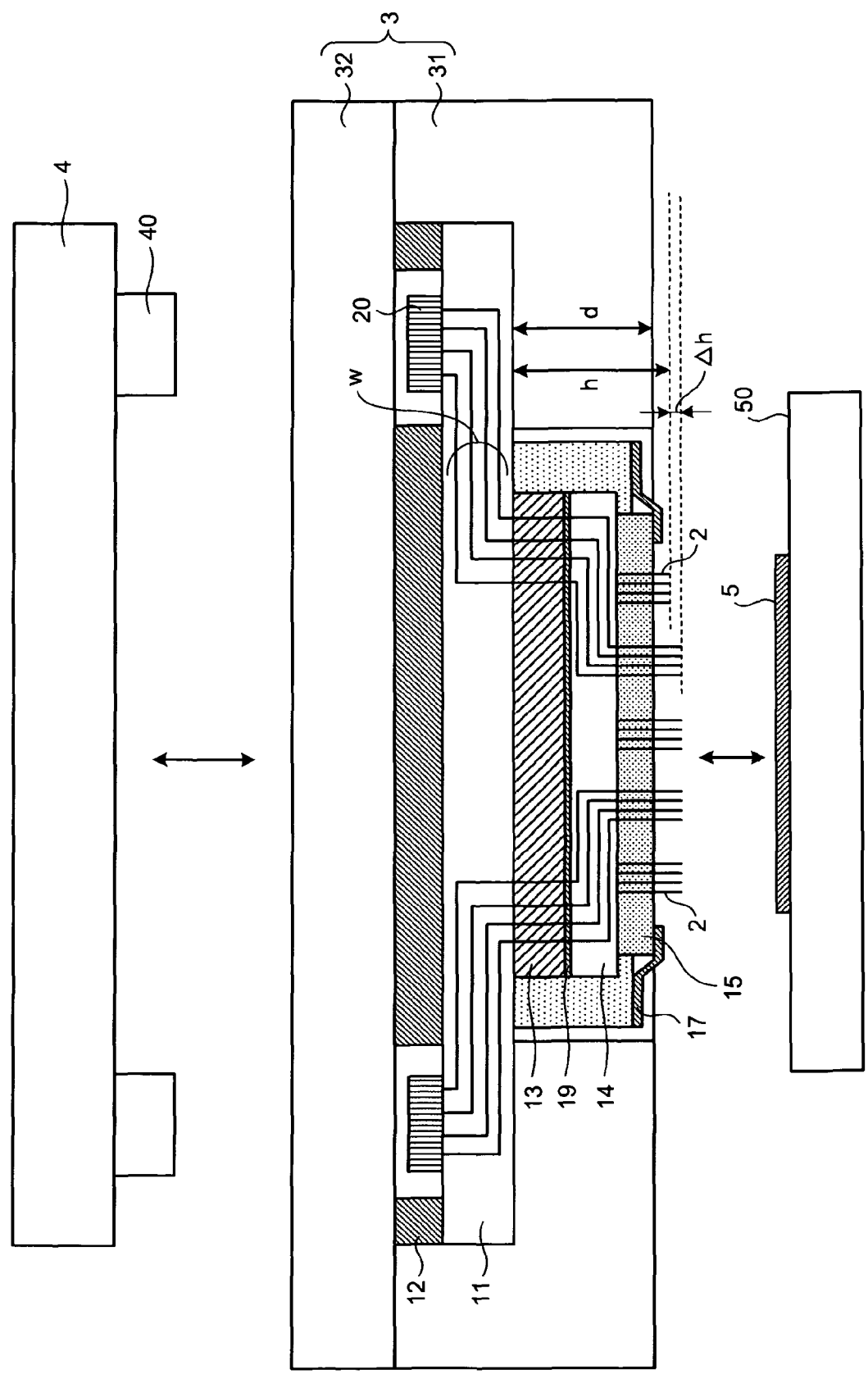
FIG. 4 is a diagram of an overview of a test performed by using the probe card according to the first embodiment of the present invention.

FIG. 1 is an exploded perspective view of the structure of relevant part of a probe card according to a first embodiment of the present invention. FIG. 2 is a diagram of the structure of the probe card according to the first embodiment. FIG. 3 is a sectional view taken along an A-A line shown in FIG. 2 and is a diagram in which an upper part shown in FIG. 1 is a lower surface side. FIG. 4 is a schematic diagram of a section taken along a B-B line shown in FIG. 2 including part of wirings and an overview of a test performed by using the probe card according to the first embodiment. A probe card 1 shown in FIGS. 1 to 4 electrically connects, using a plurality of probes 2 (conductive contacts), a semiconductor wafer as a test object and a testing device including a circuit structure for generating a signal for a test.

The probe card 1 is formed in a disk shape and includes a wiring board 11 that realizes electric connection to the testing device, a reinforcing member 12 that is attached to one surface of the wiring board 11 and reinforces the wiring board 11, an interposer 13 that relays wirings from the wiring board 11, a space transformer 14 that is stacked on and fastened to the interposer 13 and transforms a space of the wirings relayed by the interposer 13, and a probe head 15 that is formed in a disk shape having a diameter smaller than that of the wiring board 11, stacked on the space transformer 14, and houses and holds the probes 2 in association with the semiconductor wafer as the test object. Further, the probe card 1 includes a holding member 16 that is fastened to the wiring board 11 and collectively holds the interposer 13 and the space transformer 14 in a stacked state, a leaf spring 17 that is fastened to the holding member 16 and fixes an end of the probe head 15, and a plurality of post members 18 (first post members) embedded in a predetermined place of the wiring board 11.

The wiring board 11 is formed by using an insulating substance such as Bakelite or epoxy resin. On the wiring board 11, a wiring layer for electrically connecting the probes and the testing device is formed three-dimensionally by via holes and the like. Through holes 111 for embedding the post members 18 therein are provided in a number same as the number of the post members 18. In FIG. 3, a state in which the wiring board 11, which is originally flat, is deformed and a longitudinal section of the wiring board II becomes wavy.

As shown in FIG. 4, one ends of wirings w formed in the wiring board 11 are connected to a plurality of male connectors 20 disposed on a surface of the wiring board 11, which is a surface on a side where the reinforcing member 12 is attached, to perform connection to the testing device (not shown). On the other hand, the other ends of the wirings w are electrically connected to the probes 2, which are housed and held by the probe head 15, via the space transformer 14.

The male connectors 20 are disposed radially with respect to the center of the wiring board 11, form pairs with respective female connectors 40 provided in positions opposed to the male connectors 20 on a connector seat 4 of the testing device, and establish electric connection to the probes 2 and the testing device when terminals of the male connectors 20 and the female connectors 40 come into contact with each other. As a connector including the male connectors 20 and the female connectors 40, a zero insertion force (ZIP) type connector that requires almost no external force for inserting and pulling out male connectors and applies press contact force using external force after connectors are joined can be applied. If this ZIF type connector is applied, the probe card 1 and the testing device hardly suffer stress due to connection even if the number of the probes 2 is large. Electric connection can be surely obtained. Moreover, durability of the probe card 1 can be improved. The female connectors can be disposed on the wiring board 11 and the male connectors can be disposed on the connector seat 4. A shape and arrangement positions of the male connectors are not always limited to those explained above.

Instead of connecting the probe card 1 and the testing device by using the connector as explained above, terminals such as pogo pins having a spring action can be provided in the testing device to connect the probe card 1 to the testing device via such terminals.

The reinforcing member 12 includes a circular outer peripheral portion 121 that has substantially the same diameter as the wiring board 11, a central portion 122 that has the center the same as that of a circle formed by the outer peripheral portion 121 and is formed in a disc shape having a surface area slightly larger than an area of the surface of the interposer 13, and a plurality of coupling portions 123 (four in FIG. 1) that extend from an outer peripheral direction of the central portion 122 to reach the outer peripheral portion 121 and couple the outer peripheral portion 121 and the central portion 122. A plurality of recesses 124, on which ends of the post members 18 are placed, are formed in the central portion 122 of the reinforcing member 12. The reinforcing member 12 is realized by a material of high hardness such as alumite-finished aluminum, stainless steel, an invar material, Kovar material (registered trademark), or duralumin.

Figure 5:
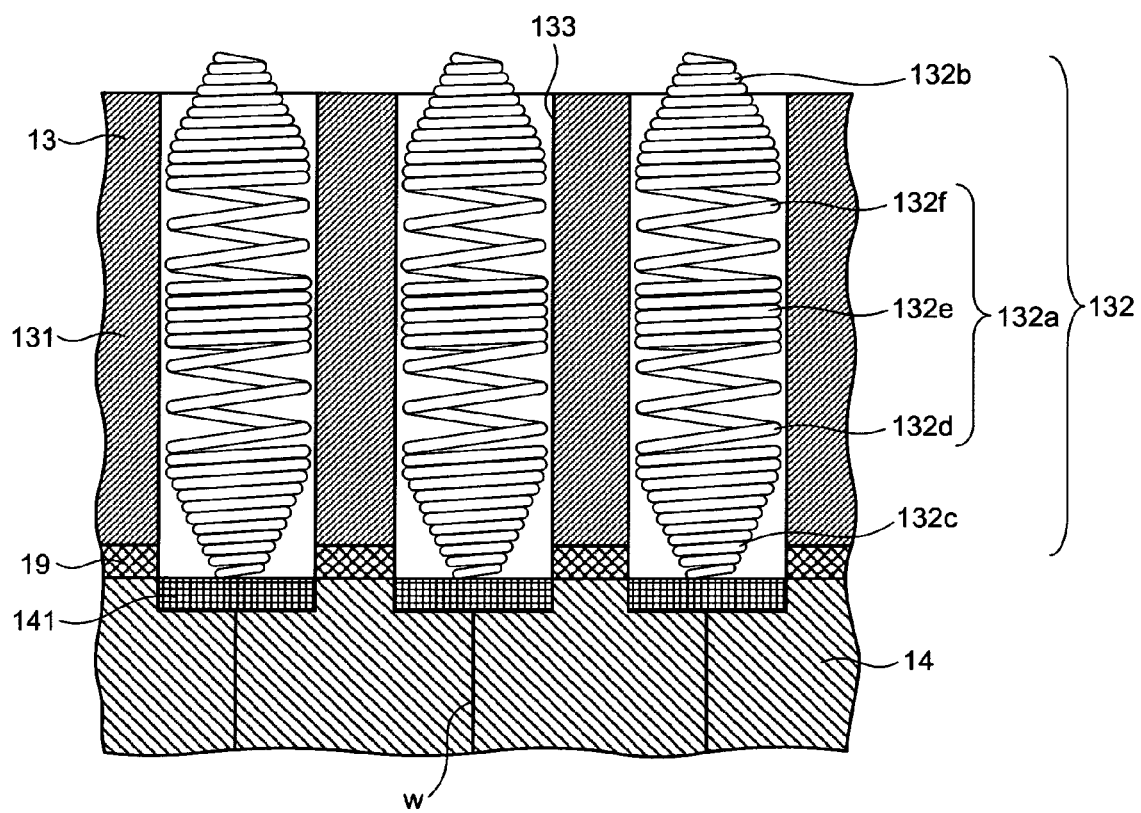
FIG. 5 is a partial sectional view of the internal structure of an interposer and a transformer and a bonded form thereof.
Figure 6:
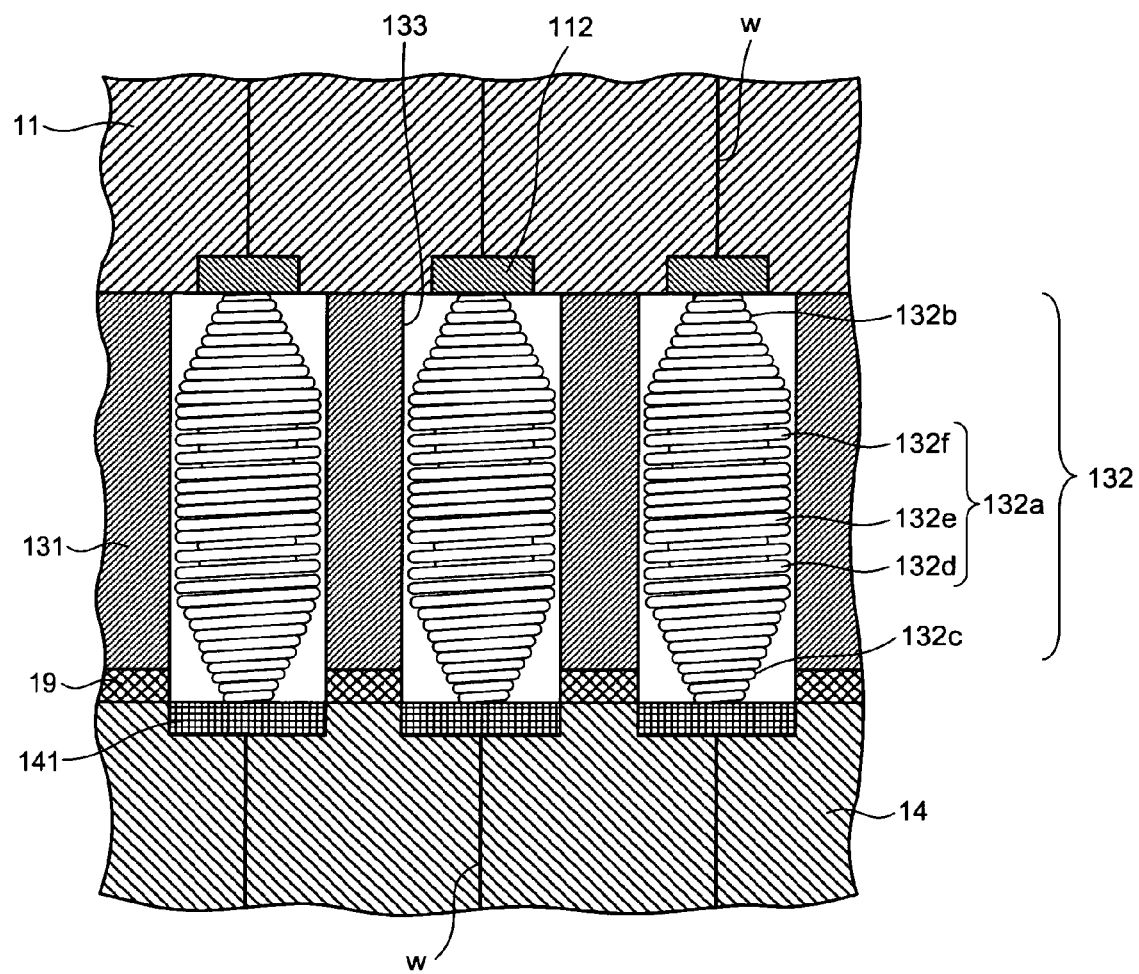
FIG. 6 is a diagram of the structure of the probe card around the interposer.

The interposer 13 and the space transformer 14 are formed in thin plate shapes having regular octagonal surfaces substantially congruent with each other. Surfaces opposed to each other of the interposer 13 and the space transformer 14 are bonded by an adhesive 19. FIG. 5 is a partial sectional view of the internal structure of the interposer 13 and the space transformer 14 and a bonded form of both the members. FIG. 6 is a partial sectional view of a state after the wiring board 11 is attached to a place same as that shown in FIG. 5. As shown in these figures, the interposer 13 includes a housing 131 forming a base material and a plurality of connection terminals 132 housed and held in the housing 131. The space transformer 14 includes the wirings w, electrode pads 141 connected to one end sides of the wirings w, led out from a surface of the base member, and set in contact with the connection terminals 132 of the interposer 13, electrode pads 142 led out to a surface on a side opposed to the probe head 15 and having pitch width smaller than pitch width of the electrode pads 141 (concerning the electrode pads 142, please refer to FIG. 7 explained below).

The housing 131 of the interposer 13 is made of a single member. A plurality of through holes 133 that individually house the connection terminals 132 are formed in the housing 131. Therefore, the housing 131 is made of machinable ceramics that can be machined. Because the interposer 13 and the space transformer 14 are bonded by the adhesive 19 and integrated, opened surfaces of the through holes 133 on one side are closed by the space transformer 14. Consequently, the through holes 133 can be straight holes having a single diameter shown in FIG. 5 and the like. Therefore, because the through holes 133 can be formed by, for example, simply performing drilling using one kind of drill, manufacturing is easy and a reduction in a manufacturing period and a reduction in cost can be realized.

The connection terminals 132 of the interposer 13 include coil spring portions 132a formed by winding around conductive materials to be formed in a cylindrical shape and pairs of electrode pins 132b and 132c closely wound in a taper shape from both ends of the coil spring portions 132a. The coil spring portions 132a include steadily wound portions 132d, closely wound portions 132e, and roughly wound portions 132f formed at a pitch relatively rougher than that of the steadily wound portions 132d. With the connection terminals 132 having such structure, it is possible to prevent tangling from occurring in the coil spring portions 132a when the connection terminals 132 are compressed and deformed. The connection terminals 132 are made of coil-like single sprig members. Therefore, only a smaller number of components are required and it is possible to reduce cost required for manufacturing and maintenance. Moreover, the electrode pins 132b and 132c are formed in the taper shape and are elastically in contact with the electrode pads 141 and 112, respectively. Therefore, it is possible to reduce fluctuation of positions of projecting ends of the electrode pins 132b and 132c and bring the electrode pins 132b and 132e into uniform contact with a contact body.

In the state shown in FIG. 6, the coil spring portions 132a are in a substantially close contact state because the steadily wound portions 132d and the roughly wound portions 132f are bent. The tips of the electrode pins 132b of the connection terminals 132 come into contact with the electrode pads 112 of the wiring board 11. On the other hand, the tips of the electrode pins 132c of the connection terminals 132 come into contact with the electrode pads 141 of the space transformer 14. Consequently, the connection terminals 132 relay electric connection between the wiring board 11 and the space transformer 14.

The space transformer 14 is formed by polyimide multi-layer wirings with an insulating material such as aluminum ceramics used as a base material. A coefficient of thermal expansion (CTE) of the alumina ceramics is about 7.2 ppm/° C. On the other hand, a coefficient of thermal expansion of the machinable ceramics forming the housing 131 of the interposer 13 is about 1 to 10 ppm/° C. The coefficient of thermal expansion is different depending on a material. In the first embodiment, consistency of values of the coefficient of thermal expansion between the interposer 13 and the space transformer 14 is realized by using machinable ceramics, the CTE of which is about 7 to 7.5 ppm/° C. Even if temperature changes between low temperature (−50° C.) and high temperature (200° C.) during a test, a bimetal effect does not occur and warp of the interposer 13 and the space transformer 14 is suppressed to keep flatness.

When the interposer 13 and the space transformer 14 are bonded by the adhesive 19, the adhesive 19 is arranged over the entire surface of the space transformer 14 in a pattern excluding the electrode pads 141. When the adhesive 19 is liquid, the arrangement of the adhesive 19 is performed by brush coating, roller coating, spraying, coating by a spinner, immersion in the adhesive, or the like. When the adhesive 19 is semisolid or solid, the adhesive 19 is arranged by, after forming the adhesive 19 in a sheet shape of appropriate thickness, dissolving or dispersing the adhesive 19 into appropriate density by a solvent, a diluent, or the like and then performing the coating or the immersion explained above.

As the adhesive 19, thermosetting adhesives such as epoxy resin, phenolic resin, urea resin, melamine resin, polyester resin, and silicone resin can be used. Thermoplastic adhesives such as polyvinyl acetate, polyvinyl alcohol, polyvinyl chloride, cellulose nitrate, and polyacrylic ester can also be used as the adhesive 19. In addition, pressure sensitive adhesives and thermo compression bonding adhesives can also be used as the adhesive 19.

A brazing material such as solder can also be used as the adhesive 19. When the brazing material has conductivity, after an oxide film is formed on the surface of the brazing material to impart insulating properties thereto, the brazing material is used as the adhesive 19. A melting point of the brazing material has to be higher than 200° C. that is highest temperature during use. On the other hand, if a melting point of metal for brazing is too high, distortion occurs when the temperature of the metal is reset to the normal temperature after the brazing. In view of these points, the melting point of the brazing material applied as the adhesive 19 is preferably higher than 200° C. and as low as possible.

When the interposer 13 and the space transformer 14 are bonded, first, the adhesive 19 is arranged on a fastening surface of any one of the interposer 13 and the space transformer 14 or both by any one of the methods explained above and brought into a semi-hardened state. In this semi-hardened state, adhesive force hardly appears and, moreover, it is unlikely that the adhesive 19 flows into the through holes 133 and the electrode pads 141. Therefore, for example, it is also possible to form the through holes 133 after arranging the adhesive 19 on the fastening surface of the interposer 13 to be brought into the semi-hardened state.

Thereafter, after the interposer 13 and the space transformer 14 are stacked, the adhesive 19 is regularly hardened, whereby the interposer 13 and the space transformer 14 are completely bonded and integrated. When the adhesive 19 is a thermosetting adhesive, the adhesive 19 is regularly hardened by being heated to predetermined temperature or pressed in addition to the heating. On the other hand, when the adhesive 19 is a pressure sensitive adhesive, the adhesive 19 is regularly hardened by being pressed at predetermined pressure.

The interposer 13 and the space transformer 14 can be bonded by being stacked after a double-sided tape of a thin film shape is created to be formed in a pattern excluding the electrode pad 141 and the double-sided tape is stuck to the surface of the space transformer 14.

By bonding the interposer 13 and the space transformer 14 as explained above, compared with both the members simply stacked, it is possible to improve rigidity of the members as a whole and improve flatness of the space transformer 14. Consequently, flatness of the probe head 15 stacked on the space transformer 14 is also improved and flatness of the tips of the probes 2 housed and held by the probe head 15 is also improved. Therefore, accuracy of contact of the probes 2 with a semiconductor wafer 5 is increased. As a result, because the thickness does not have to be increased by forming a dummy wiring layer in the space transformer 14, it is possible to reduce a manufacturing period and hold down manufacturing cost.

Figure 7:
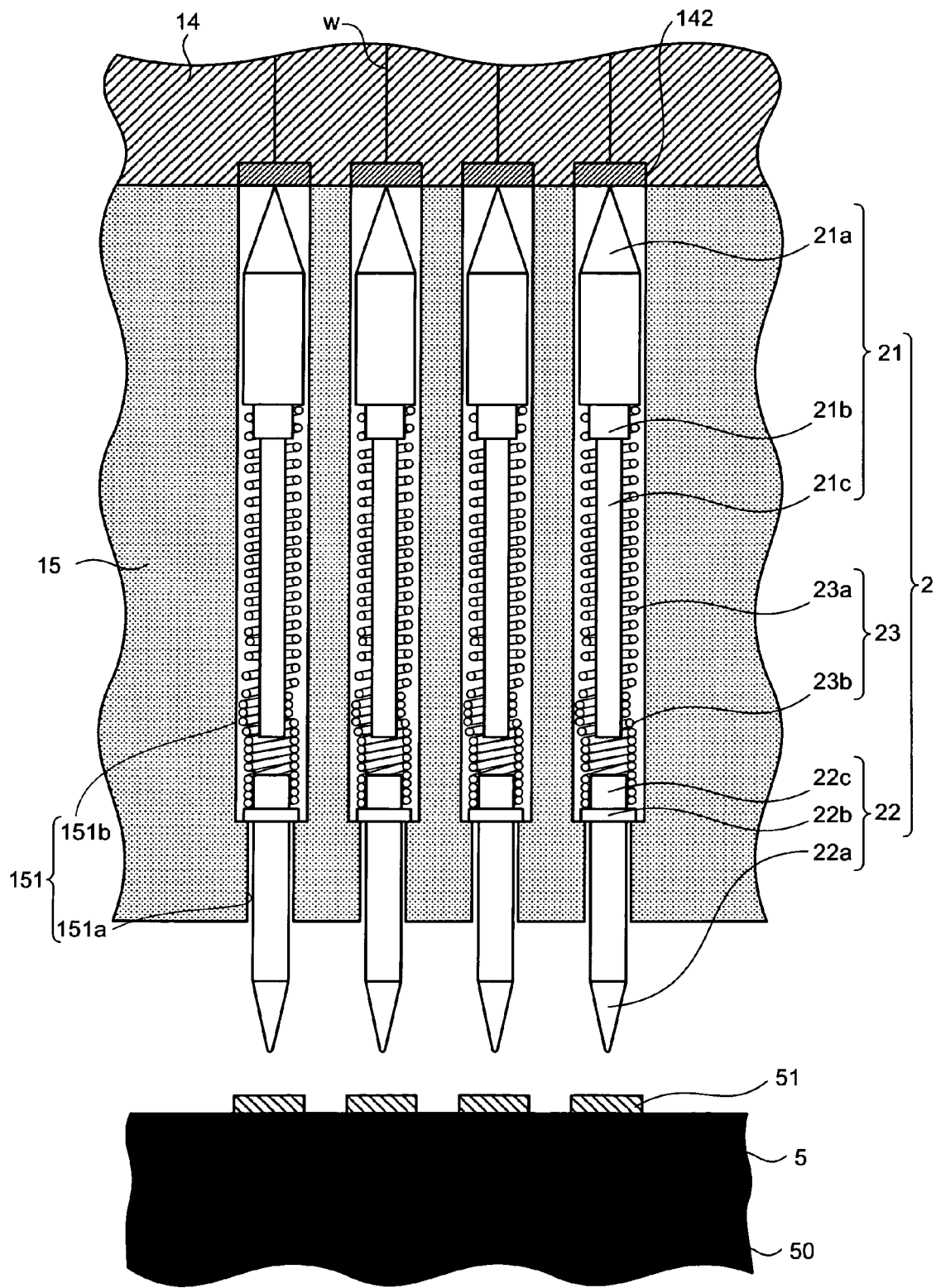
FIG. 7 is an enlarged partial sectional view of the structure of a main part of probes and a probe head.

Subsequently, the structure of the probe card 1 is explained. The probe head 15 is formed in a disk shape and houses and holds a plurality of probes in a probe housing area 15p shown in FIG. 2 to project perpendicularly to the paper surface in FIG. 2. FIG. 7 is an enlarged partial sectional view of the structure of a main part of the probe head 15 and the detailed structure of the probe 2 housed by the probe head 15.

The probes 2 include needle-like members 21 that are in contact with the space transformer 14, needle-like members 22 that project in a direction opposed to the needle-like members 21 and come into contact with electrode pads 41 of the semiconductor wafer 5, and spring members 23 that are provided between the needle-like members 21 and the needle-like members 22 and resiliently couple the two kinds of needle-like members 21 and 22. The needle-like members 21 and 22 coupled to each other and the spring members 23 have identical axes. An arrangement pattern of the probes 2 in the probe head 15 is decided according to an arrangement pattern of electrode pads 51 of the semiconductor wafer 5 as a test object.

The needle-like members 21 include needle-like portions 21a that have sharp tips projecting in a tip direction, boss portions 21b that are provided in base end portions on the opposite side of the sharp tips of the needle-like portions 21a and have a diameter smaller than a diameter of the needle-like portions 21a, and shaft portions 21c that extend out from surfaces on the opposite side of sides of the boss portions 21b in contact with the needle-like portions 21a. The needle-like members 21 are formed in a shape axially symmetrical in a longitudinal direction thereof. On the other hand, the needle-like members 22 include needle-like portions 22a that have sharp tips projecting in a tip direction, flange portions 22b that are provided in base end portions on the opposite side of the sharp tips of the needle-like portions 22a and have a diameter larger than a diameter of the needle-like portions 22a, and boss portions 22c that project from surfaces on the opposite side of sides of the flange portions 22b in contact with the needle-like portions 22a and have a diameter smaller than the diameter of the flange portions 22b. The needle-like members 21 are formed in a shape axially symmetrical in a longitudinal direction thereof.

The needle-like member 21 sides of the spring members 23 are loosely wound portions 23a and, on the other hand, the needle-like member 22 sides thereof are tightly wound portions 23b. Ends of the loosely wound portions 23a are wound around the boss portions 21b of the needle-like members 21. Ends of the tightly wound portions 23b are wound around the boss portions 22c of the needle-like members 22. The loosely wound portions 23a and the boss portions 21b are joined and the tightly wound portions 23b and the boss portions 22c are joined by any one of a spring winding force and soldering or both.

In the probes 2 having the structure described above, because the spring members 23 are provided, the needle-like members 21 and 22 are resiliently movable in the up to down direction in FIG. 7. At least a part of the tightly wound portions 23b are in contact with the shaft portions 21c of the needle-like members 21 in a state in which the needle-like members 21 are in contact with the electrode pads 141, i.e., a state shown in FIG. 7. In other words, the length in an axial direction of the tightly wound portions 23b is set to length with which the state shown in FIG. 7 can be realized. An inner diameter of the spring members 23 is slightly larger than an outer diameter of the boss portions 21b and the boss portions 22e. Consequently, it is possible to achieve improved resiliency of the spring members 23.

The probe head 15 is formed by using an insulating material such as ceramics. Holes 151 for housing the probes 2 are pierced through the probe head 15 in a thickness direction (vertical direction in FIG. 7) according to an array of the semiconductor wafer 5. The holes 151 include small diameter holes 151a formed from a facet on the semiconductor wafer 5 side over at least predetermined length smaller than the length in a longitudinal direction of the needle-like portions 22a and large diameter holes 151b that have center axes the same as those of the small diameter holes 151a and have a diameter larger than that of the small diameter holes 151a. As shown in FIG. 7, an inner diameter of the small diameter holes 151a is slightly larger than an outer diameter of the needle-like portions 22a of the needle-like members 22 and slightly smaller than an outer diameter of the flange portions 22b. The holes 151 are formed in a stepped hole shape in this way, whereby (the needle-like members 22 of) the probes 2 are prevented from coming off.

The probe head 15 can be divided into two, i.e., upper and lower portions, along the vertical direction in FIG. 7. In this case, the two portions are coupled by using screws and positioning pins. To prevent a plate on a lower side from being expanded by an initial load of the probes 2, it is preferable that the thickness of the portion on the lower side is set larger than the thickness of the portion on the upper side. By dividing the probe head 15 in this way, it is possible to easily replace the probes 2.

Although not shown in the figure, the probes 2 housed and held by the probe head 15 include probes for ground and probes for power supply. Therefore, among the wirings w connected to the probes 2, there are wirings connected to a ground layer and a power supply layer.

The holding member 16 is made of a material same as that of the reinforcing member 12 and has a hollow portion of a regular octagonal pole in which the interposer 13 and the space transformer 14 can be stacked and held. The holding member 16 presses the interposer 13 and the space transformer 14, which are integrated by the adhesive 19, against the wiring board 11 and holds the holding member 16 and the space transformer 14 to thereby apply pressure necessary for electrically connecting the wiring board 11 and the space transformer 14 via the interposer 13.

The leaf spring 17 is made of a material having elasticity such as phosphor bronze, stainless steel (SUS), or beryllium copper and formed in a thin annular shape. In an inner circumference of the leaf spring 17, pawls 171 as pressing members for holding the interposer 13, the space transformer 14, and the probe head 15 are uniformly provided over the entire circumference. Such pawls 171 uniformly press a portion near an edge of the surface of the probe head 15 over the entire circumference in the direction of the wiring board 11. Therefore, a substantially uniform initial load is generated in the probes 2 housed by the probe head 15. Warp of the probe head 15 can be prevented.

The post members 18 include large diameter portions 18a of a cylindrical shape having height slightly larger than the thickness of the wiring board 11 and small diameter portions 18b of a cylindrical shape having center axes same as those of the large diameter portions 18a. The small diameter portions 18b can be fit in the recesses 124 of the reinforcing member 12. Therefore, the diameter of the small diameter portions 18b is substantially the same as the diameter of the recesses 124. The height of the small diameter portions 18b is substantially the same as the depth of the recesses 124. The post members 18 can be made of a material same as that of the reinforcing member 12. However, in view of required high machining accuracy, stainless steel is suitable. As shown in FIG. 1, the post members 18 are arranged symmetrically to the center of the regular octagon formed by the surface of the interposer 13. By embedding the post members 18 in the wiring board 11 in this way, it is possible to define the width in the thickness direction of the section of the wiring board 11 according to the height of the post members 18. Therefore, even if deformation such as warp, waviness, or irregularity occurs in the wiring board 11 (see FIG. 3), it is possible to improve accuracies of parallelism and flatness of the probe head 15 without being affected by the deformation.

In assembling the probe card 1, when the wiring board 11, the reinforcing member 12, the interposer 13, the space transformer 14, the probe head 15, and the holding member 16 are stacked one after another, it is more preferable to perform positioning of the members using predetermined positioning pins.

An overview of a test of the semiconductor wafer 5 performed by using the probe card 1 having the structure explained above is explained with reference to FIGS. 4 and 7. As shown in FIG. 4, in the test, the probe card 1 is mounted on and fixed to a prober 3 that is a device for bringing the probes 2 and the semiconductor wafer 5 into contact with each other. The prober 3 includes a probe card holder 31 on which a bottom surface of the wiring board 11 is placed and held and a pressing jig 32 that is located above the probe card holder 31 and presses the probe card 1 downward and fixes the probe card 1.

The contact between the probes 2 and the semiconductor wafer 5 is realized by raising a wafer chuck 50, on which the semiconductor wafer 5 is placed, with predetermined driving means. To allow the electrode pads 51 of the semiconductor wafer 5 and the tips of the needle-like portions 22a of the needle-like member 22 to accurately come into contact with each other, the tip height h of the probes 2 after being stroked by the contact needs to be larger than the thickness d of the probe card holder 31 (h>d). In FIG. 4, tip positions of the probes 2 in contact with the semiconductor wafer 5 are schematically indicated by a group of (four) probes 2 held at the right end of the probe head 15 (in FIG. 4, a stroke amount of the probes 2 by the contact with the semiconductor wafer 5 is represented as Ah).

When the electrode pads 51 of the semiconductor wafer 5 are brought into contact with the tips of the needle-like portions 22a of the needle-like members 22 by raising the wafer chuck 50 from the state shown in FIG. 7, the needle-like members 22 rises and spring members 23 are compressed and further curved and meander. A part of the inner peripheries of the tightly wound portions 23b maintains a state of contact with the shaft portions 21c of the needle-like members 21. Therefore, a linear electric signal along an axis direction of the probes 2 flows to the tightly wound portions 23b. Therefore, an electric signal does not flow in a coil shape to the loosely wound portions 23a. It is possible to suppress an increase in the inductance of the probes 2.

The probe card according to the first embodiment of the present invention explained above includes the flat wiring board having a wiring pattern corresponding to the circuit structure for generating a signal for a test, the interposer that is stacked on the wiring board and relays the wirings of the wiring board, the space transformer that is stacked on and fastened to the interposer, transforms a space of the wirings relayed by the interposer, and leads the wirings out to the surface on the opposite side of the side opposed to the interposer, and the probe head that is stacked on the space transformer and houses and holds the probes. Therefore, it is possible to realize improvement of rigidity of the space transformer easily and at low cost.

According to the first embodiment, the interposer and the space transformer are fastened and integrated. Therefore, it is unnecessary to increase the thickness of the space transformer more than necessary and it is possible to increase the thickness of the interposer. In addition, the through holes for inserting the connection terminals in the interposer only have to be straight holes. Therefore, it is possible to reduce manufacturing cost for the probe card. Because the number of days required for manufacturing of the probe card can be reduced, it is possible to quickly respond to a request of a customer.

Moreover, according to the first embodiment, accuracy of the tip positions of the probes is also improved according to the improvement of accuracies of flatness and parallelism. Therefore, it is possible to suppress fluctuation in positions in the height direction of the tips among the probes and substantially fix strokes of all the probes and it is possible to obtain stable contact resistance. In addition, because the strokes of all the probes are substantially fixed, a load larger than necessary is not applied to a specific probe. Therefore, the electrode pads of the semiconductor wafer are not excessively damaged and it is possible to prevent deterioration in yield in a process for connecting dies and packages (wire bonding, etc.), breakage of the wirings connected to the electrode pad, and the like.

Figure 8:
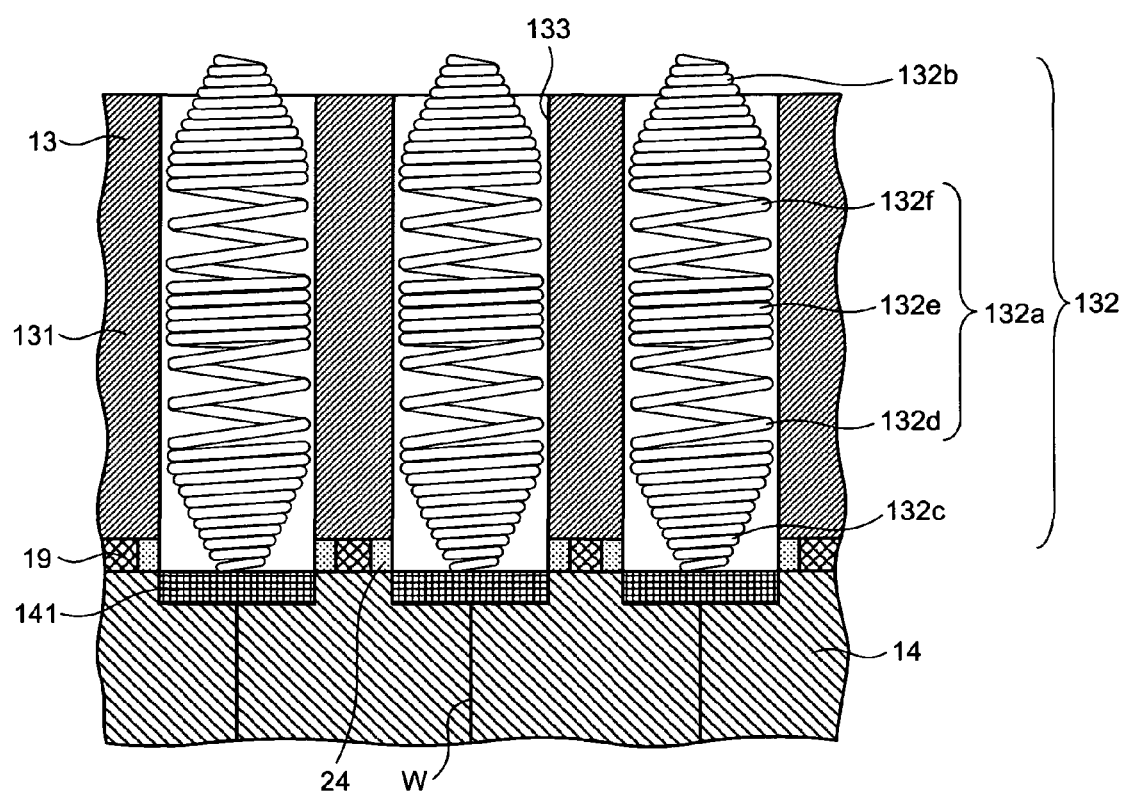
FIG. 8 is a partial sectional view of another bonded form of the interposer and the space transformer.
Figure 9:
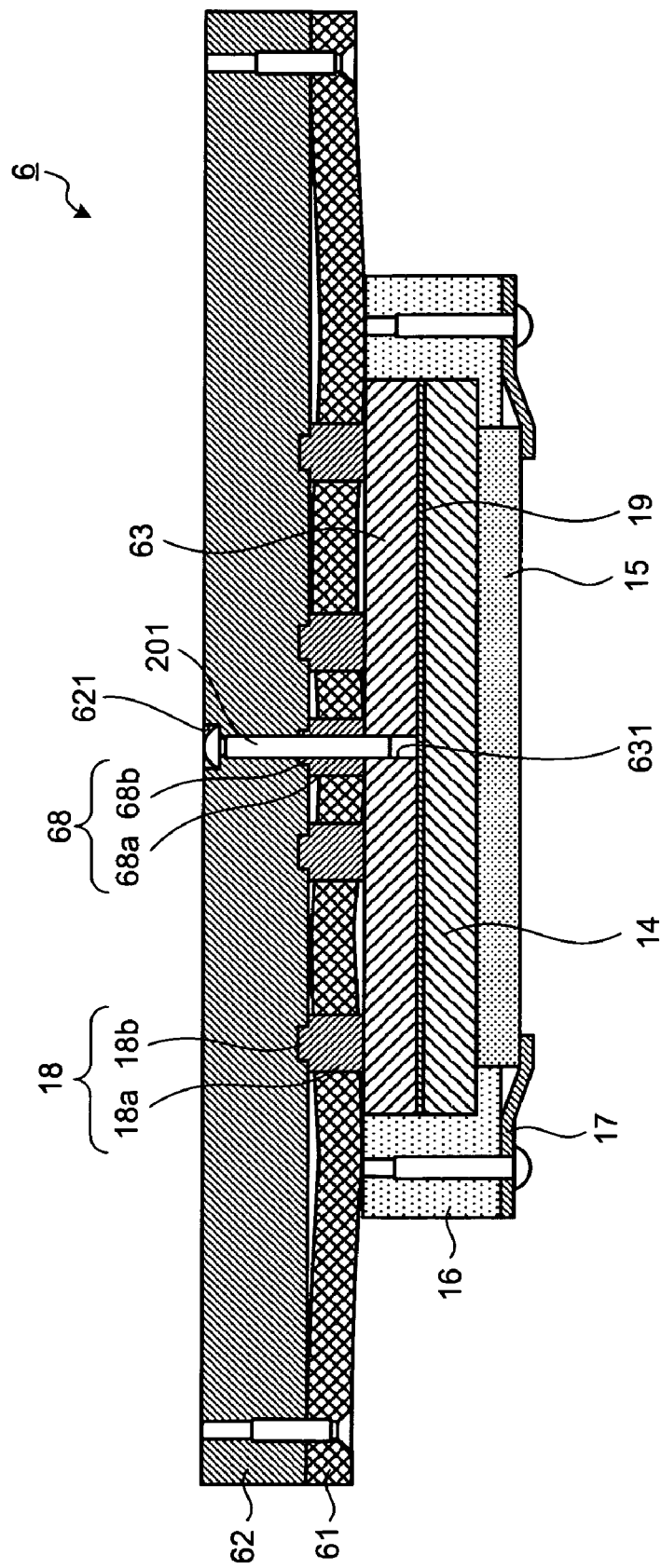
FIG. 9 is a sectional view of the structure of a probe card according to a second embodiment of the present invention.

A method of bonding the interposer 13 and the space transformer 14 is not limited to the method explained above. For example, as shown in FIG. 8, a resist 24 can be uniformly provided to surround the through holes 133 of the interposer 13 and the electrode pads 141 of the space transformer 14. In this case, after the resist 24 having predetermined thickness is applied (formed) on the fastening surface, the resist 24 is exposed to be formed in a predetermined pattern by applying masking thereto. Subsequently, the adhesive 19 is arranged in a portion where the resist 24 is removed by the exposure. As a result, the resist 24 functions as a wall to prevent the adhesive 19 from flowing into a place including the through holes 133 and the electrode pads 141, i.e., a place for electrically connecting the interposer 13 and the space transformer 14. The bonding method explained here is disclosed more in detail in, for example, Japanese Patent Application Laid-open No. 2000-91391, Second Embodiment FIG. 9 is a diagram of the structure of a probe card according to a second embodiment of the present invention. FIG. 9 corresponds to FIG. 3 referred to in the explanation of the first embodiment. A probe card 6 shown in FIG. 9 includes a wiring board 61 that is formed in a disk shape and realizes electric connection to a testing device, a reinforcing member 62 that is attached to one surface of the wiring board 61 and reinforces the wiring board 61, and an interposer 63 that relays wirings from the wiring board 61. The probe card 6 includes the space transformer 14, the probe head 15, the holding member 16, and the leaf spring 17 having the structures same as those included in the probe card 1 according to the first embodiment. The post members 18 are embedded in the wiring board 61.

The interposer 63 and the space transformer 14 are bonded by the adhesive 19 and integrated. In addition, in the probe card 6, one screw member 201 (a second screw member) is inserted in a thickness direction from the surface (an upper surface in FIG. 9) of the reinforcing member 62 to the interposer 63. In the wiring board 61, a post member 68 (a second post member) having a hollow portion, through which the screw member 201 can be inserted, is embedded in the center of the wiring board 61. The post member 68 includes a large diameter portion 68a of a hollow cylindrical shape having thickness slightly larger than the thickness of the wiring board 61 and a small diameter portion 68b of a hollow cylindrical shape having a center axis same as that of the large diameter portion 68a.

In the reinforcing member 62 and the interposer 63, to insert the screw member 201, through holes 621 and 631 that coaxially communicate with each other in the thickness direction when both the members are assembled are provided, respectively. Threads with which the screw member 201 can be screwed are appropriately provided on inner sides of the through holes 621 and 631 (not shown).

With the probe card according to the second embodiment of the present invention explained above, as in the first embodiment, it is possible to realize improvement of rigidity of the space transformer easily and at low cost.

The number and arrangement places of screw members 201 are not always limited to those explained above and only has to be appropriately decided according to conditions such as rigidity required of the probe card and the thicknesses and surface areas of the wiring board, the interposer, the space transformer, and the like.

Third Embodiment

Figure 10:
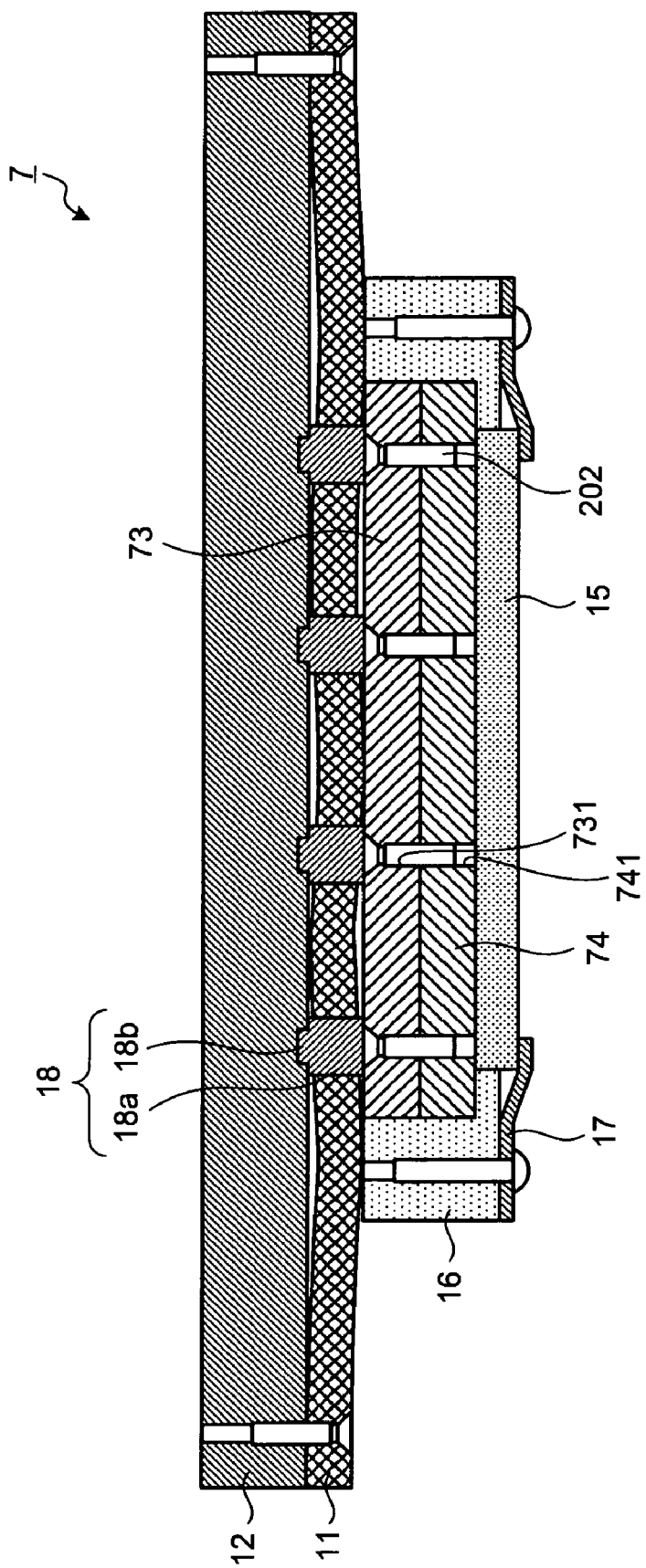
FIG. 10 is a sectional view of the structure of a probe card according to a third embodiment of the present invention.
Figure 11:
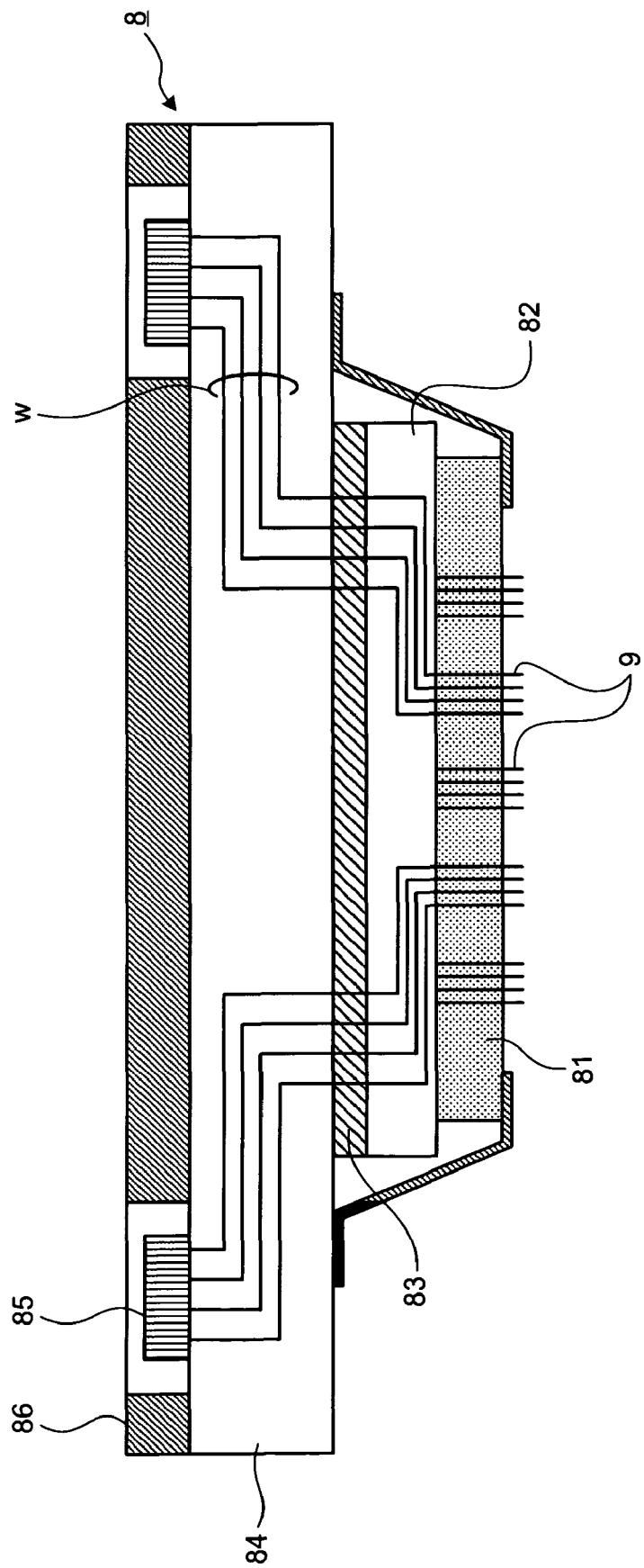
FIG. 11 is a sectional view of the structure of a conventional probe card.

FIG. 10 is a diagram of the structure of a probe card according to a third embodiment of the present invention.

FIG. 10 corresponds to FIG. 3 referred to in the explanation of the first embodiment. A probe card 7 shown in FIG. 10 includes the wiring board 11, the reinforcing member 12, the probe head 15, the holding member 16, and the leaf spring 17 having the structures same as those included in the probe card 1 according to the first embodiment. The post members 18 are embedded in the wiring board 11.

The probe card 7 further includes an interposer 73 that relays wirings from the wiring board 11 and a space transformer 74 that transforms a space of the wirings relayed by the interposer 73. The interposer 73 and the space transformer 74 are fastened by a plurality of screw members 202 (first screw members) and integrated. Therefore, in the interposer 73 and the space transformer 74, through holes 731 and 741 that coaxially communicate with each other in a thickness direction when both the members area assembled are formed in predetermined positions, respectively. Threads with which the screw members 202 can be screwed are appropriately provided on inner sides of the through holes 731 and 741 (not shown).

In FIG. 10, the screw members 202 are inserted from the interposer 73 to the space transformer 74 to fasten both the members. However, conversely, the screw members 202 can be inserted from the space transformer 74 to the interposer 73.

With the probe card according to the third embodiment of the present invention explained above, it is possible to obtain effects same as those of the two embodiments explained above.

In the third embodiment, it is possible to realize firmer integration of the interposer 73 and the space transformer 74 by further arranging the adhesive 19 between both the members.

Other Embodiments

The first to third embodiments have been explained in detail as the best modes for carrying out the present invention. However, the present invention should not be limited only by the three embodiments explained above. For example, the space transformer can be made of a glass epoxy board and bonded and integrated with the interposer. In this case, a coefficient of thermal expansion of the glass epoxy board is 12 to 15 ppm/° C. and is conspicuously larger than the coefficient of thermal expansion (1 to 10 ppm/° C.) of the machinable ceramics forming the interposer. However, in terms of rigidity represented by Young's modulus, because the rigidity of the machinable ceramics (Young's modulus=about 65 GPa) is sufficiently larger than the rigidity of glass epoxy (Young's modulus=about 25 GPa), the rigidity of the integrated members substantially depends on the rigidity of the machinable ceramics. Therefore, in this case, it is more preferable to reduce the thickness of the glass epoxy board as much as possible and, on the other hand, increase the thickness of the machinable ceramics to increase the dependency on the rigidity of the machinable ceramics.

Shapes of the interposer, the space transformer, and the probe head are not limited to those explained above. For example, surface shapes of the interposer and the space transformer can be circular. In this case, because a probe card for FWLT has highest symmetry, the shapes are suitable when top priority is given to flatness and parallelism of the probe card. Besides, the surfaces of the interposer and the space transformer can be formed in an appropriate regular polygon and the probe head is formed in a regular polygon similar to the regular polygon.

Any of known various kinds of probes may be applied to the probe card according to the present invention.

The invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As described above, the probe card according to the present invention is useful for an electric characteristic test for a semiconductor wafer and is particularly suitable for the FWLT.

The invention claimed is:

1. A probe card that houses a plurality of probes for electrically connecting a semiconductor wafer as a test object and a circuit structure for generating a signal for a test, the probe card comprising:
a flat wiring board that has a wiring pattern corresponding to the circuit structure;
an interposer that is stacked on the wiring board and relays wirings of the wiring board;
a space transformer that is stacked on and fastened to the interposer, transforms a space between the wirings relayed by the interposer, and leads the wirings out to a surface opposite a surface facing the interposer;
a probe head that is stacked on the space transformer and houses and holds the probes; and
a resist layer on surfaces of the interposer and the space transformer facing each other, the resist layer surrounding where electrical connection is established between the interposer and the space transformer,
wherein the interposer and the space transformer, when stacked, are bonded by an adhesive, and
wherein the adhesive is applied to surfaces of the interposer and the space transformer facing each other except where electrical connection is established between the interposer and the space transformer.

2. The probe card according to claim 1, wherein the adhesive is applied in a sheet form.

3. The probe card according to claim 1, wherein the interposer and the space transformer, when stacked, are fastened together by a first screw member.

4. The probe card according to claim 1, further comprising a plurality of first post members that are embedded in the wiring board to pierce through the wiring board from a surface of the wiring board where the interposer is stacked, the first post members having height larger than thickness of the wiring board.

5. The probe card according to claim 4, further comprising:
a second post member that has height identical to the height of the first post members and is embedded in a center of the wiring board to pierce through the wiring board, the second post member including a hollow portion piercing in a height direction thereof; and
a second screw member that is inserted through the hollow portion of the second post member and fastens the wiring board and the interposer.

6. The probe card according to claim 1, wherein the interposer includes:
a plurality of connection terminals that is made of a conductive material and is extensible and compressible in an axial direction; and
a housing that is made of an insulating material and includes a plurality of through holes to individually house the connection terminals.

7. The probe card according to claim 6, wherein the connection terminals are in a coil shape, and each include:

a pair of electrode pins each of which is closely wound to be tapered toward either end in the axial direction; and a coil spring that connects between the electrode pins.

8. The probe card according to claim 7, wherein the coil spring includes:

a tightly wound portion that is arranged in a middle, in the axial direction, of each of the connection terminals;

a constantly wound portion that is arranged on a side of the tightly wound portion; and a loosely wound portion that is arranged on a side of the tightly wound portion other than where the constantly wound portion is arranged, in which a coil is wound more loosely than in the constantly wound portion.

* * * * *